US006636170B1

(12) United States Patent
Dijkmans

(10) Patent No.: US 6,636,170 B1
(45) Date of Patent: Oct. 21, 2003

(54) SIGNAL CONVERTER WITH DIGITAL/ANALOG CONVERSION AND NOISE-DEPENDENT VARIABILITY OF OUTPUT SIGNAL BANDWIDTH

(75) Inventor: Eise C. Dijkmans, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/534,213

(22) Filed: Mar. 24, 2000

(30) Foreign Application Priority Data

Mar. 26, 1999 (EP) .............................. 99200933

(51) Int. Cl.[7] .............................................. H03M 1/66
(52) U.S. Cl. ........................................ 341/144; 341/143
(58) Field of Search ...................... 341/144, 61, 143, 341/123, 118, 120, 139; 327/552

(56) References Cited

U.S. PATENT DOCUMENTS

| 4,868,572 | A | * | 9/1989 | Reiber .......................... 341/145 |
| 5,058,170 | A | * | 10/1991 | Kanamori ..................... 381/92 |
| 5,278,558 | A | * | 1/1994 | Roth ............................ 341/120 |
| 5,617,090 | A | * | 4/1997 | Ma et al. ...................... 341/141 |
| 5,712,635 | A | * | 1/1998 | Wilson et al. ............... 341/144 |
| 6,137,349 | A | * | 10/2000 | Menkhoff et al. ........... 327/552 |
| 6,144,712 | A | * | 11/2000 | Samueli et al. ............. 375/371 |

* cited by examiner

Primary Examiner—Brian Young
Assistant Examiner—Joseph Lauture
(74) Attorney, Agent, or Firm—Eric M. Bram

(57) ABSTRACT

A signal converter includes a digital/analog converter and a low pass filter. The converter includes control means for amending the ratio of sampling frequencies of the D/A input signal and the D/A output signal or of the low pass filter.

7 Claims, 1 Drawing Sheet

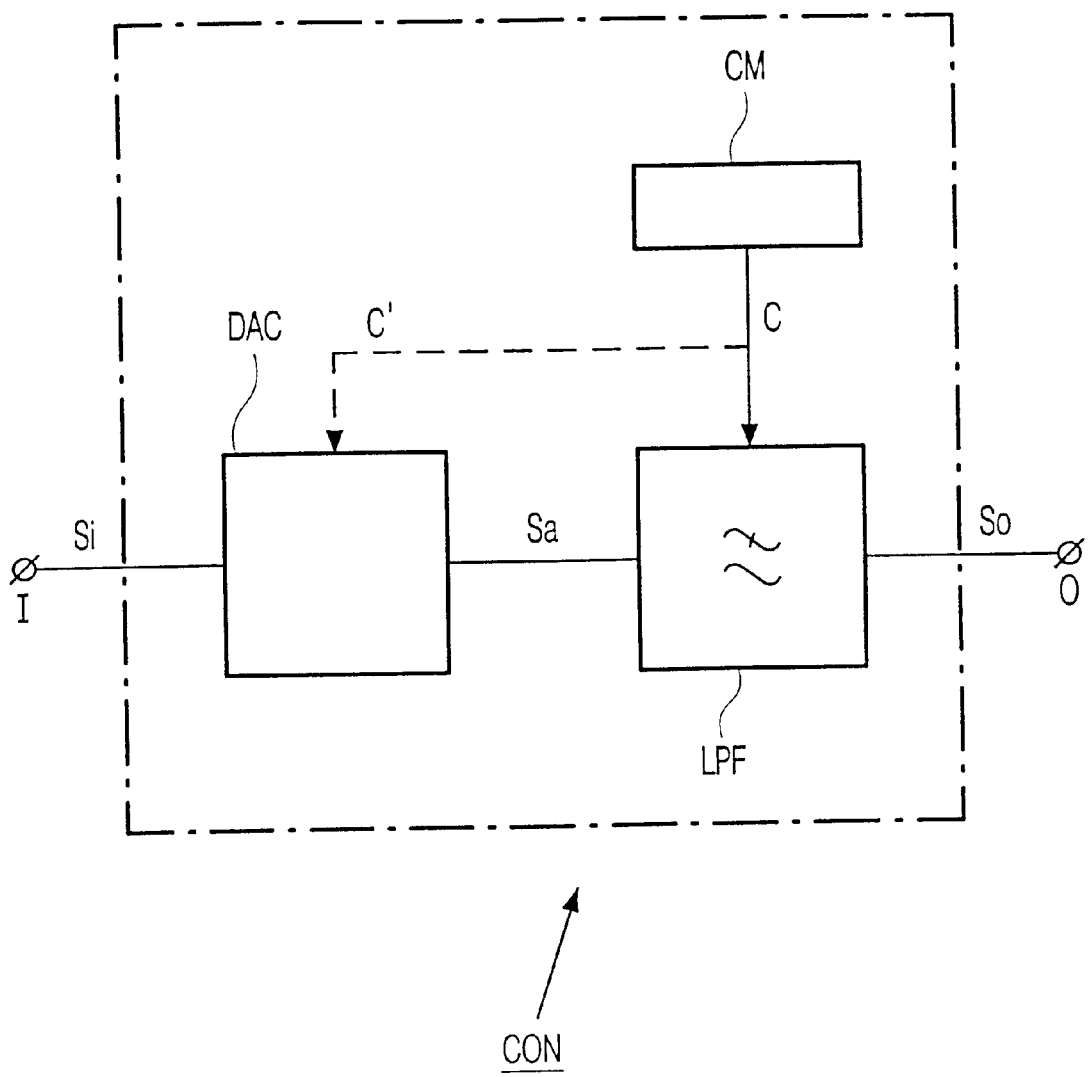

SIGNAL CONVERTER WITH DIGITAL/ANALOG CONVERSION AND NOISE-DEPENDENT VARIABILITY OF OUTPUT SIGNAL BANDWIDTH

BACKGROUND OF THE INVENTION

The invention relates to a converter as described in the preamble of claim 1. Converters comprising a D/A converter and a low pass filter are known in the art. For example oversampled converters are used in audio reproduction systems in combination with a digital upsampling low pass filter followed by either an analog time continuous or a time discrete low pas filter which is needed to remove the remaining high frequency content of the output signal. The sampling frequencies of the input data of the converter and of the time discrete low pas filter are mostly equal or have a fixed ratio. In systems using noise shaping converters of the delta sigma type, which is also a proposed format for SACD players, the initial signal band width can be very high but a large amount of high frequency noise is generated in the delta sigma conversion, which sometimes can overload the connected audio equipment. In which case the bandwidth of the output signal has to be reduced.

SUMMARY OF THE INVENTION

It is inter alia on object of the invention to provide a converter, which overcomes the drawbacks of the prior art. To this end a converter according to the invention comprises the features as claimed in claim 1. In this way it is possible to amend the bandwidth of the output signal depending on the noise by changing the ratio of sampling frequencies of the noise shaped D/A input data and of the (time discrete) low pass filter.

Embodiments of the invention are described in the dependent Claims.

BRIEF DESCRIPTION OF THE DRAWING

The invention and additional features which may optionally be used to advantage, will be apparent from and elucidated with reference to examples described below hereinafter and shown in the FIGURE:

The FIGURE shows a block schematic example of a converter according to the invention.

DESCRIPTION OF THE PREFERRED EMBODIMENTS

The FIGURE shows an example of a converter CON according to the invention comprising an input I for receiving a digital input signal Si. The input is coupled with a D/A converter DAC for converting the received digital input signal Si into an analog signal Sa. Before the analog signal can be supplied to the output So a filtering is necessary in a low pass filter LPF. This low pass filter comprises a control input for controlling the pass frequency of the filter with a control signal C. The output of the low pass filter LPF is coupled to the output O of the converter CON for supplying an output signal So.

By amending the passing range of the low pass filter LPF it is possible to overcome the drawbacks of the prior art whereby the high frequency noise could be overloaded the connected audio equipment.

As an example when both the D/A converter and the low pass filter LPF are running at 64 times 44.1 kHz, the cut off frequency of the low pass filter LPF is chosen 20 kHz. Increasing the sampling frequency of the low pass filter with a multiple of 64 times 44.1 kHz, the output bandwidth will increase to for example 40, 60 or 80 kHz, without the need for extra analog hardware.

The control means CM generate a control signal C to be supplied to the control input of the low pass filter LPF. The control means will detect (not indicated in the FIGURE) the high frequency noise and will on the basis of this detection or expected high frequency noise supply the control signal C. The control signal C will determine the pass frequency range of the low pass filter LPF.

When the input signal Si has a sampling frequency Fs, the D/A converter DAC has a sampling frequency N*Fs, and the low pass filter LPF has a sampling frequency M*Fs, whereby M>=N. In the prior art situation N=M=1.

In the FIGURE the control means CM are coupled via a dashed line with the D/A converter for supplying a control signal C'. With this dashed line is is indicated that the control means can be coupled with the low pass filter LPF, or the D/A converter DAC or with both.

By making the ratio of the sampling frequencies of the input signal Si, and the D/A converter or the low pass filter variable it is possible to amend the passing range of the low pass filter in dependence of the high frequency noise. In this way an overloading of the connected audio equipment can be overcome.

What is claimed is:

1. A converter comprising:

a digital-to-analog converter;

a low pass filter; and a controller for amending, as a function of a high frequency noise parameter, a ratio of sampling frequencies of the digital-to-analog converter or of the low pass filter.

2. The converter to claim 1, wherein the controller is coupled to the low pass filter for supplying a control signal.

3. The converter of claim 1, wherein the controller is coupled to the digital-to-analog converter for supplying a control signal.

4. The converter of claim 1, wherein the digital-to-analog input signal has a sampling frequency Fs, the digital-to-analog output signal has a sampling frequency N*Fs, and the low pass filter has a sampling frequency M*Fs, with M being at least as large as N, whereby at least one of M and N are depending on a control signal from the controller.

5. A converter comprising:

a digital-to-analog converter;

a low pass filter coupled to an output of the digital-to-analog converter; and a controller for amending a ratio of sampling frequency of the digital-to-analog converter, and for controlling a pass frequency of the low pass filter.

6. The converter of claim 5, wherein pass frequency or the low pass filter is controlled as a function of a high-frequency noise parameter.

7. The converter of claim 5, wherein the digital-to-analog input signal has a sampling frequency Fs, the digital-to-analog output signal has a sampling frequency N*Fs, and the low pass filter has a sampling frequency M*Fs, with M being greater than N.

* * * * *